United States Patent [19]

Brummans et al.

[11] Patent Number: 4,992,055

[45] Date of Patent: Feb. 12, 1991

[54] ELECTRICAL JACKS AND HEADERS

[75] Inventors: Wilhelmus J. Brummans, Michielsgestel; Cornelus A. H. M. Sterken, Eindhoven, both of Netherlands

[73] Assignee: AMP Incorporated, Harrisburg, Pa.

[21] Appl. No.: 507,333

[22] Filed: Apr. 10, 1990

[30] Foreign Application Priority Data

Apr. 11, 1989 [GB] United Kingdom ................ 8908098

[51] Int. Cl.[5] ........................................ H05K 1/00

[52] U.S. Cl. ........................................ 439/78; 439/676

[58] Field of Search .................... 439/676, 59, 62, 65, 439/78–83, 736, 552, 554

[56] References Cited

U.S. PATENT DOCUMENTS

| | | | |
|---|---|---|---|
| 3,245,024 | 4/1966 | Evans | 439/676 |
| 3,411,130 | 11/1968 | Bushey | 439/660 |
| 4,501,465 | 2/1985 | Hoshino et al. | 439/736 |
| 4,530,554 | 7/1985 | Velsher et al. | 439/62 |
| 4,580,869 | 4/1986 | Demurjian | 439/736 |
| 4,778,410 | 10/1988 | Tanaka | 439/676 |
| 4,786,259 | 11/1988 | Paul | 439/736 |
| 4,790,769 | 12/1988 | Kanada | 439/736 |
| 4,850,902 | 7/1989 | Reed | 439/676 |

*Primary Examiner*—David L. Pirlot

*Attorney, Agent, or Firm*—Bruce J. Wolstoncroft

[57] ABSTRACT

An electrical header (40) comprises an insulating block (42) having contact elements (44) thereon which are made from bent drawn wire, each contact element (44) comprising a contact portion (46) extending across one side (41) of the block (46) and a leg (50) for insertion into a hole (H) in a printed circuit board (PCB). An electrical jack (2) for mating with the header (40) has an insulating housing (4) with a cavity (b 6) for receiving a mating plug. Terminals (10) secured in a wall (12) of the housing (4) have contact springs for engaging contacts of the plug and contact tails (18) with contact loops (24) which are bowed away from the cavity wall (12) to engage the contact portions (46) of the header (40) when it has been mated with the jack (2). This construction of the jack and header avoids the need to taper ends of the wires from which the contact elements are made, for mating with the contact tails.

6 Claims, 6 Drawing Sheets

ELECTRICAL JACKS AND HEADERS

FIELD OF THE INVENTION

This invention relates to an electrical jack and header assembly, to an electrical jack, to an electrical header, and to a method of making an electrical header.

BACKGROUND OF THE INVENTION

An electrical jack and header assembly has been proposed, wherein the jack comprises an insulating housing defining a cavity for receiving an electrical plug, and a row of electrical terminals secured to a wall of the cavity and each having a contact spring extending obliquely thereinto for engaging a respective electrical contact on the plug, and a contact tail depending from said wall, the header comprising an insulating block having secured thereto a row of contact elements each having on one side of the block a contact portion and on the opposite side of the block, a leg for insertion in a hole in a printed circuit board, the jack being matable with the header to cause each contact tail of the jack to engage a respective contact portion of the header. Such an assembly is appropriate to the telephone industry, where a telephone subscriber wishes to have an extra telephone point when such is needed. The telephone supplier assembles the header to the printed circuit board and installs it at the site of use. The subscriber mates the jack with the header when he needs said extra point.

SUMMARY OF THE INVENTION

For assembly to respective printed circuit boards, the headers may be made in strip form by molding wires into a series of the insulating blocks, the wires being severed to provide the contact elements of the header and the ends of the severed wires formed to a taper, by means of a robotic machine for assembling the headers to the printed circuit boards. In the proposed assembly the contact tails of the jack engage the contact portions of the header in parallel relationship thereto. That is why the severed ends of the wires need to be tapered, an operation which is difficult to perform without the formation of rough ends or burrs on the severed wires.

According to one aspect of the present invention, therefore, an assembly as defined in the second paragraph of this specification is characterized in that each contact tail terminates in a contact surface which is bowed in a direction perpendicular to, and away from, said wall, and in that each contact portion extends across said one side of the insulating block. Thus said contact surface engages the respective contact portion at right angles thereto so that no tapering of the severed ends of the wires is needed.

For desirably wide spacing between the insertion legs of the contact elements of the header, the leg of each contact element may depend from the opposite end of the contact portion thereof, to the next adjacent leg of the header, whereby the insertion legs depend from the header in two spaced rows.

Preferably, each contact tail of the jack terminates in a resilient loop which is bowed in a direction away from said wall, there depending from the housing, a pair of latch arms for engagement with respective latch members at opposite ends of the insulating block of the header, and at least one latch member for engaging in an opening in the printed circuit board. In this case, the jack is mated with the header by moving the jack vertically down on the header so that the absence of available space around the header poses no problem.

There may, however depend from the jack housing, at least one pair of spaced arms each having inwardly projecting end portions for insertion through notches in opposite edges of the insulating block of the header, the jack being then slidable along the block by a very short distance to engage said end portions therebeneath to secure the jack to the header.

According to a further aspect of the invention, a method of making an electrical header, in which method an elongate insulating block is molded from insulating material, a row of wires being molded into the block to extend there across with a predetermined length of each wire projecting from opposite edges of the block, is characterized in that alternate ones of said wire lengths are severed on each side of the block closely proximate to said edges, and in that each of the wire lengths is bent down at right angles to extend beneath the block. The block is formed with windows exposing portions of the wires, which extend across the block, which portions provide the contact portions of the contact elements of the header.

For reeling for supply to the machine for assembling the headers of the printed circuit boards, mentioned above, a row of the blocks is produced with the blocks in side by side parallel relationship, the blocks being spaced from each other by said predetermined length.

BRIEF DESCRIPTION OF THE DRAWINGS

For a better understanding of the invention and to show how it may be carried into effect reference will now be made by way of example to the accompanying drawings in which.

DETAILED DESCRIPTION OF THE INVENTION

Figure 1:
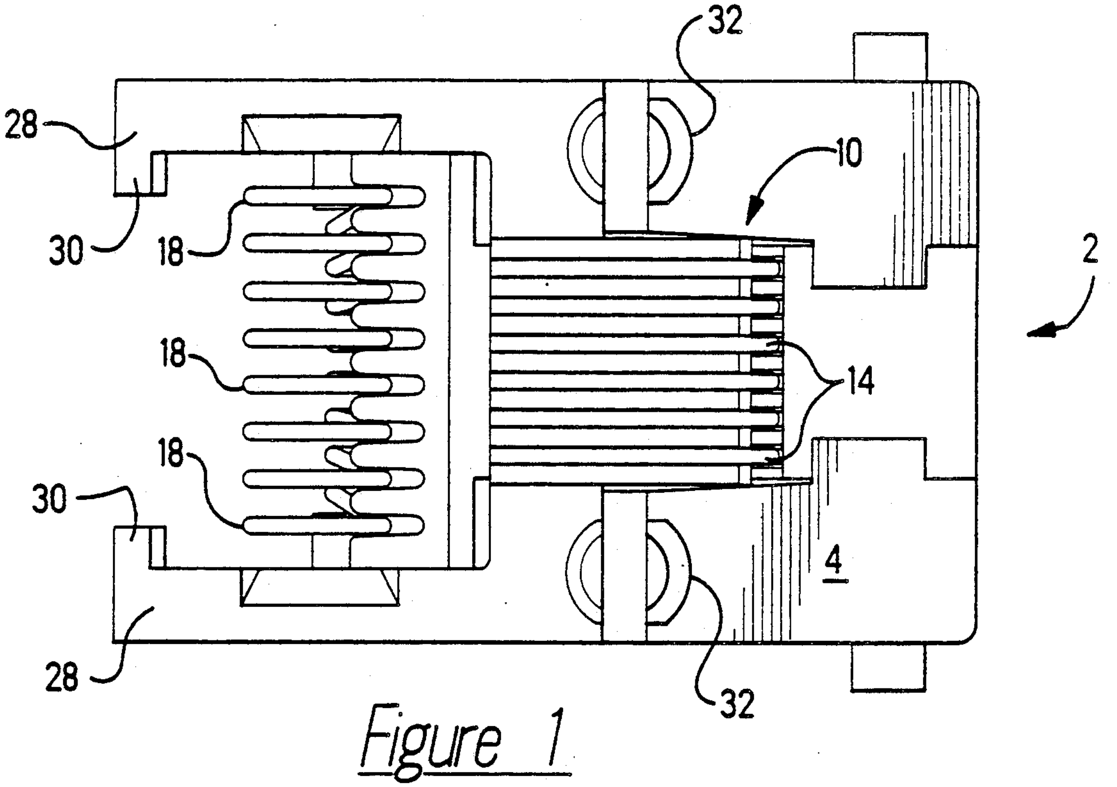
FIG. 1 is an underplan view of an electrical jack according to a first embodiment of the invention.
Figure 2:
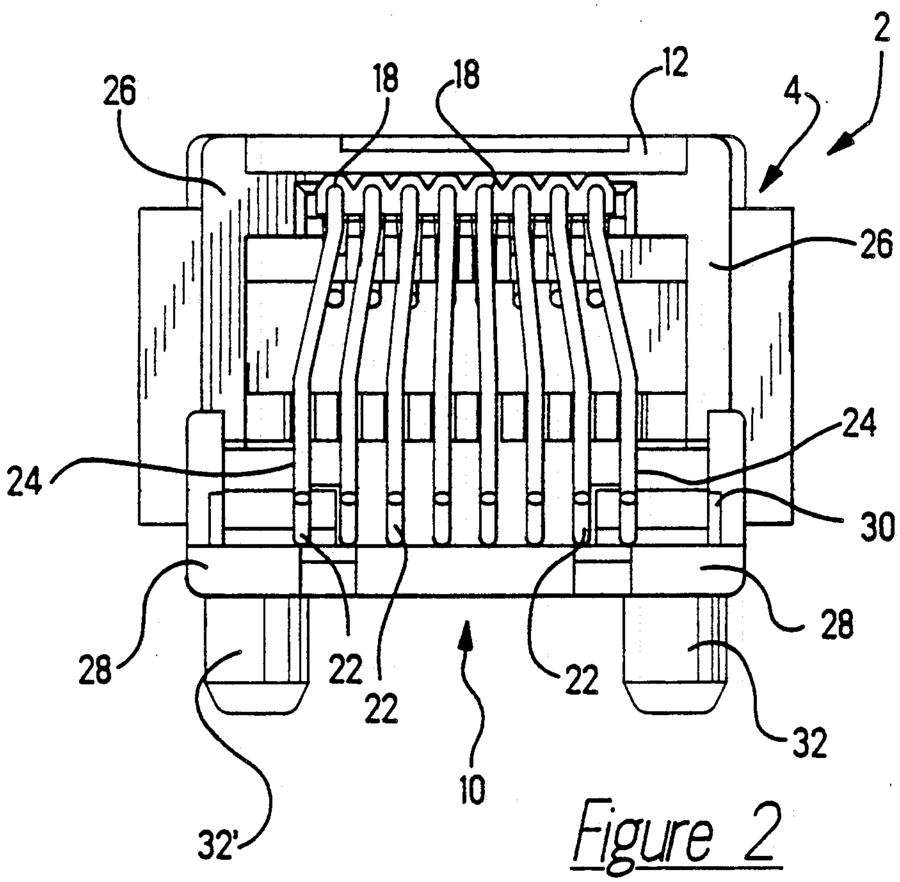
FIG. 2 is a rear end view of the jack.
Figure 3:
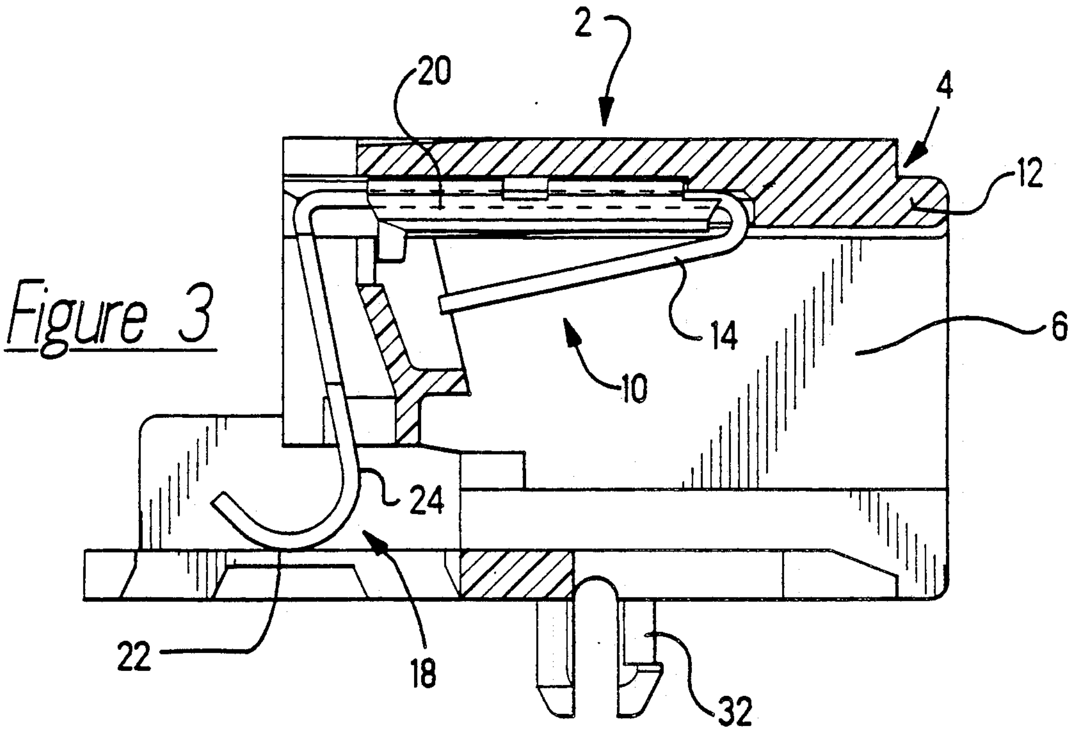
FIG. 3 is a longitudinal sectional view of the jack.
Figure 4:
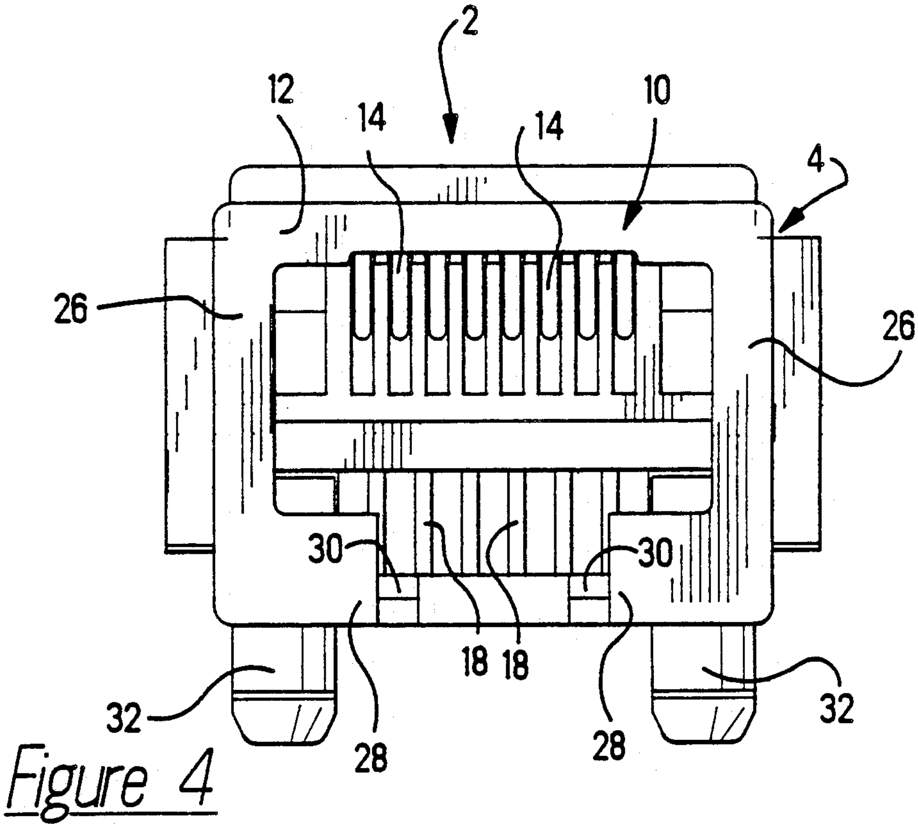
FIG. 4 is a front end view of the jack.
Figure 5:
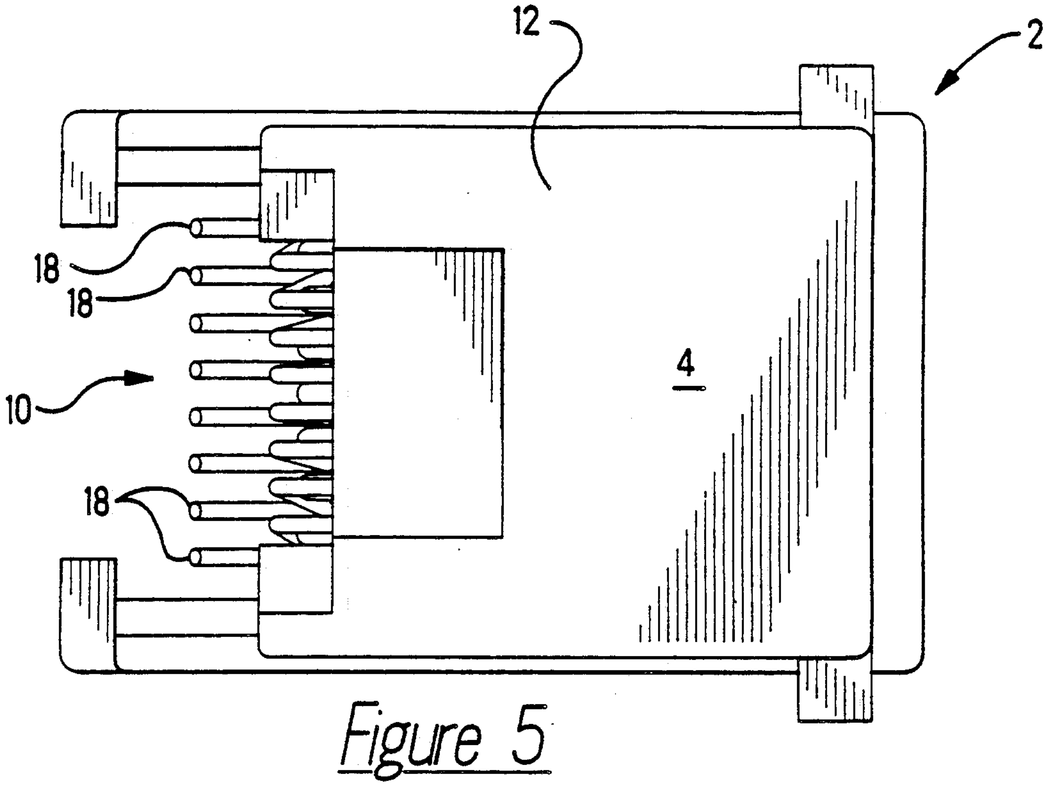
FIG. 5 is a top plan view of the jack.
Figure 6:
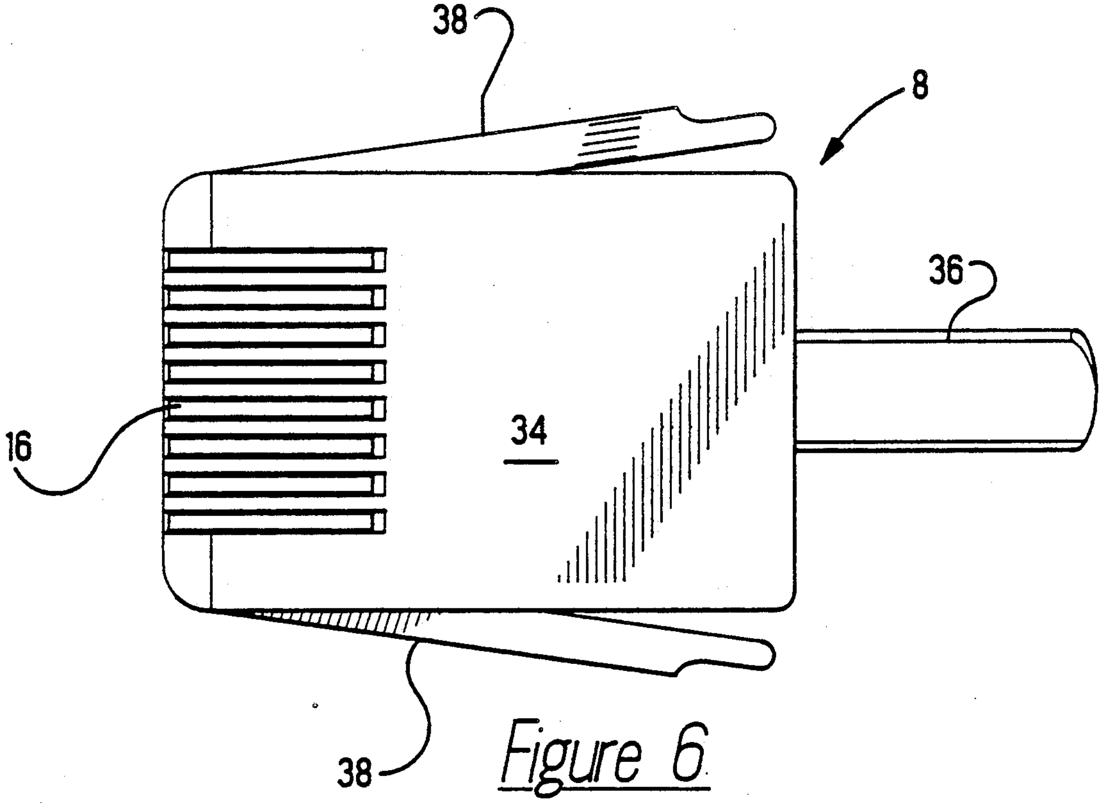
FIG. 6 is a diagrammatic top plan view of an electrical plug for mating with the jack.
Figure 7:
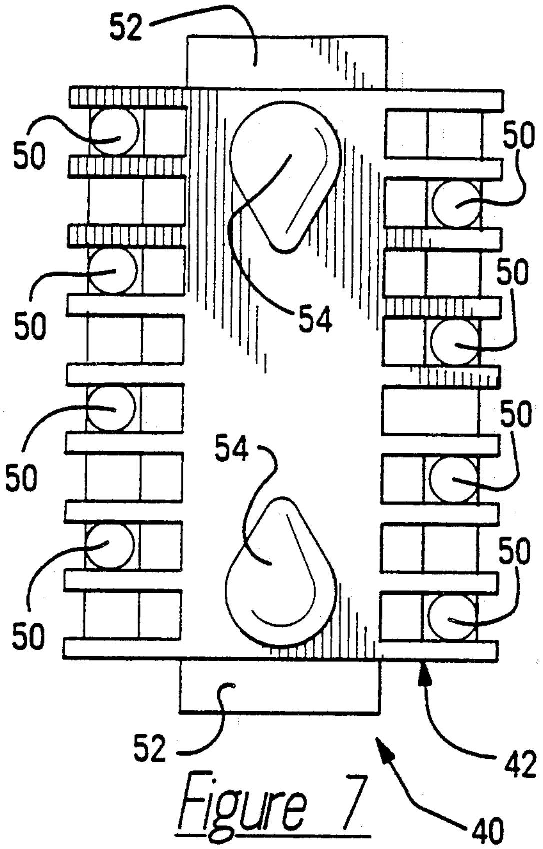
FIG. 7 is an underplan view of an electrical header for mating with the jack.
Figure 8:
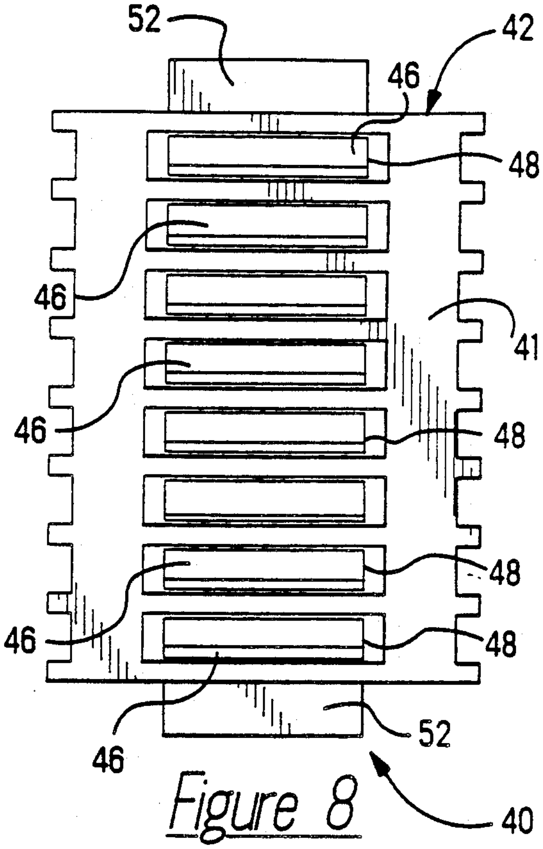
FIG. 8 is a top plan view of the header.
Figure 9:
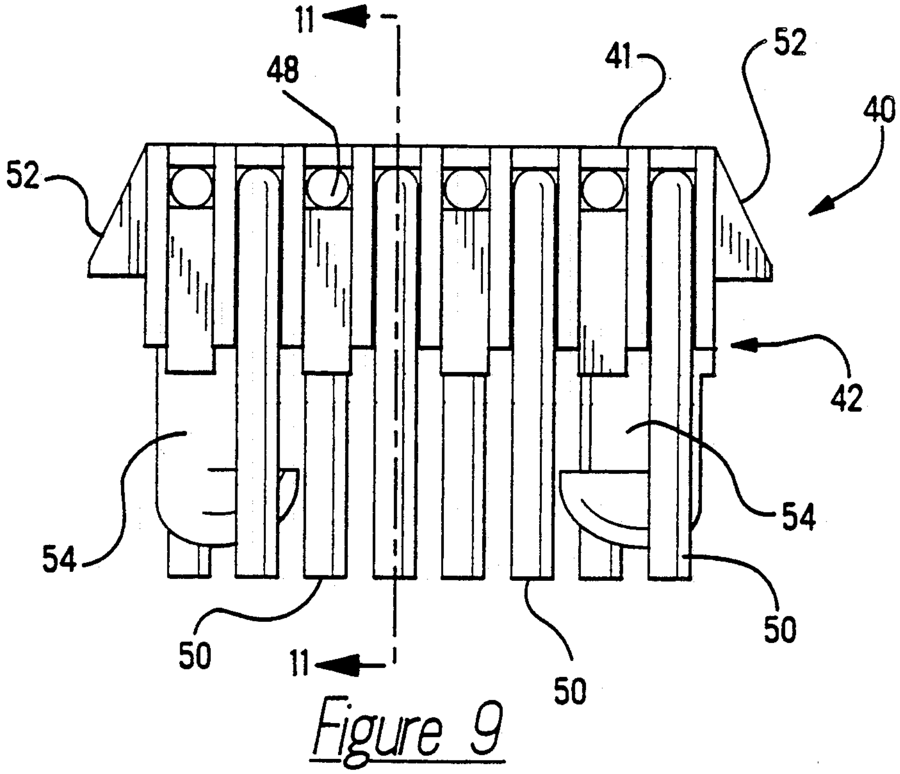
FIG. 9 is a side view of the header.
Figure 10:
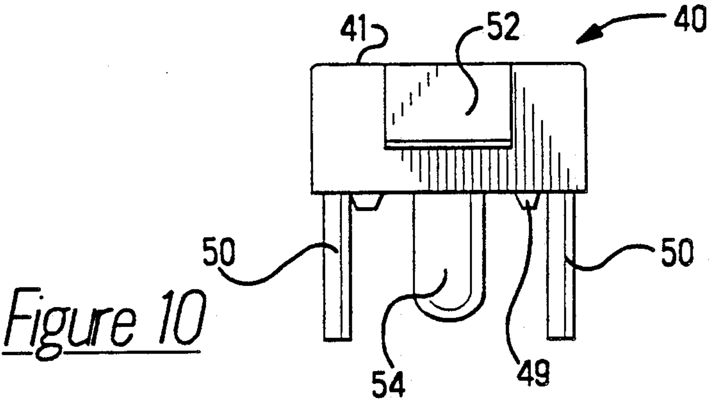
FIG. 10 is an end view of the header.

The first embodiment of the invention will now be described with reference to FIGS. 1 to 12. The jack shown in FIGS. 1 to 5 and which is generally referenced 2, comprises an insulating housing 4 defining a cavity 6 for receiving an electrical plug 8 (FIG. 6), and a row of electrical terminals 10 molded into a top wall 12 of the cavity 6 and each having a contact spring 14 extending obliquely into the cavity 6 as shown in FIG. 3, for engaging an electrical contact 16 of the plug 8 when it has been mated with the jack 2. Each terminal 10 further comprises a contact tail 18 depending from the wall 12, and from a length 20 of the terminal 10, which length is molded into the wall 12. Each contact tail 18 terminates in a contact surface 22, presented by a resilient loop 24 which is bowed in a direction perpendicularly away from the wall 12, whereby the contact surface 2 is similarly bowed. There depend from the rear ends of side walls 26 of the housing 4, which side walls are opposite to one another, a pair of latch arms 28 having inturned latching tips 30 which face each other. There also depends form the side walls 26 a pair of latch members 32, positioned forwardly of the arms 28.

The plug 8 comprises an insulating body 34 containing electrical terminals (not shown) presenting the contacts 16 which project slightly above the body 34, and which are electrically connected to wires (not shown) of a telephone cable 36. Resilient arms 38 project obliquely from opposite sides of the body 34 for latching it in the cavity 6 of the jack 2 with each contact spring 14 thereof engaging a respective contact 16 of the plug 8.

An electrical header 40 for mating with the jack 2, comprises, as shown in FIGS. 7 to 11, an insulating block 42 having molded thereinto a row of contact elements 44, each having on one side 41 of the block 42, a contact portion 46, which is exposed through a window 48 in the side 41 of the block 42. On the opposite side 49 of the block 42 to its side 41, a leg 50 of each element 44 extends at right angles to the portion 48 so as to depend below the side 49 of the block 42, for insertion in a respective hole H in a printed circuit board PCB. Each contact element 44, which is formed from circular cross section drawn wire, for example brass wire, in a manner described below, has only one leg 50, the insertion leg 50 depending from the opposite end of the contact portion 46, to the next adjacent leg 50 of the header 40, as will best be apparent from FIGS. 7 and 11, whereby the legs 50 of the header 40 depend therefrom in two spaced rows, so that accidental electrical contact between adjacent legs 50 is avoided. This arrangement of the legs 50 will also be apparent from FIG. 12, which shows the arrangement of the holes H in the board PCB. At each end thereof, the block 42 is formed with a latch member 52 for latching engagement by a respective latching tip 30 of a latch arm 28 of the jack housing 4. There depends from the side 49 of the block 42, proximate to each end thereof, a guide spigot 54, for guiding insertion in a hole H2 in the board PCB.

Figure 11:
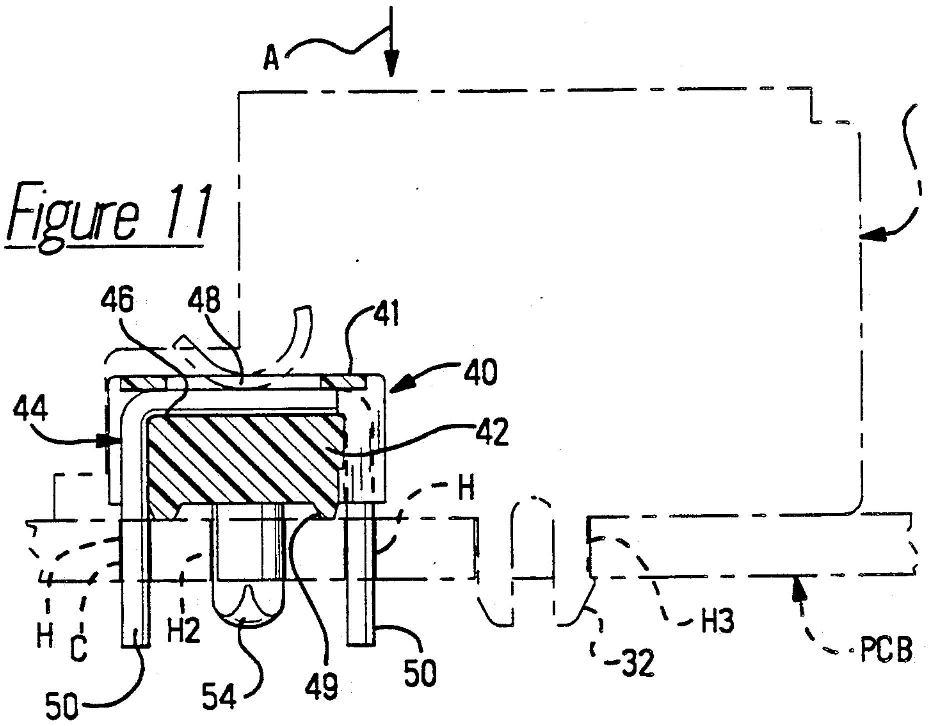
FIG. 11 is a view of the header taken on the lines 11—11 of FIG. 9, showing the header assembled to a printed circuit board and mated with the jack of FIGS. 1 to 5, the circuit board and the jack being indicated diagrammatically in broken lines.
Figure 12:
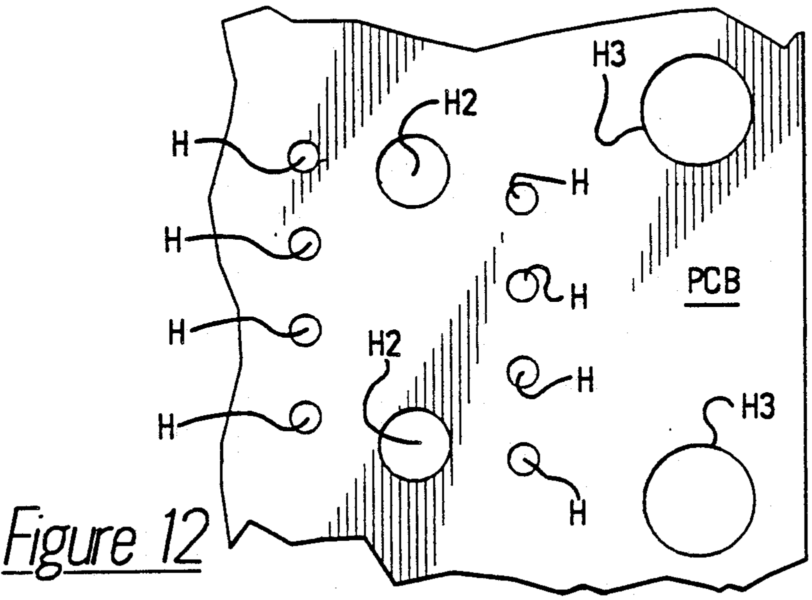
FIG. 12 is a fragmentary plan view of the printed circuit board showing mounting holes therein for the jack and the header.

When the header 40 has been assembled to the board PCB, in a manner to be described below, with each leg 50 extending through a respective hole H in the board PCB, and each spigot 54 received in a respective hole H2 in the board PCB, the jack 2 is mated with the header 40, as indicated in FIG. 11, by moving the jack 2 vertically downwards onto the header 40 in the direction of the arrow A in FIG. 11, so that each latching tip 30 latches behind a respective latch member 52 of the block 42 so that the contact surface 22 of each loop 24 of the terminals 10 of the jack 2 is firmly and resiliently pressed against a respective contact portion 46 of the header 40. At this time each latch member 32 of the jack 2 is latchingly received in a respective hole H3 in the board PCB, as shown in FIG. 11. When the plug 8 has been mated with the jack 2, each contact 16 of the plug 8, and thus each wire of the cable 36 is electrically connected to a respective conductor C (only one of which is shown in FIG. 11) on the Board PCB.

Figure 13:
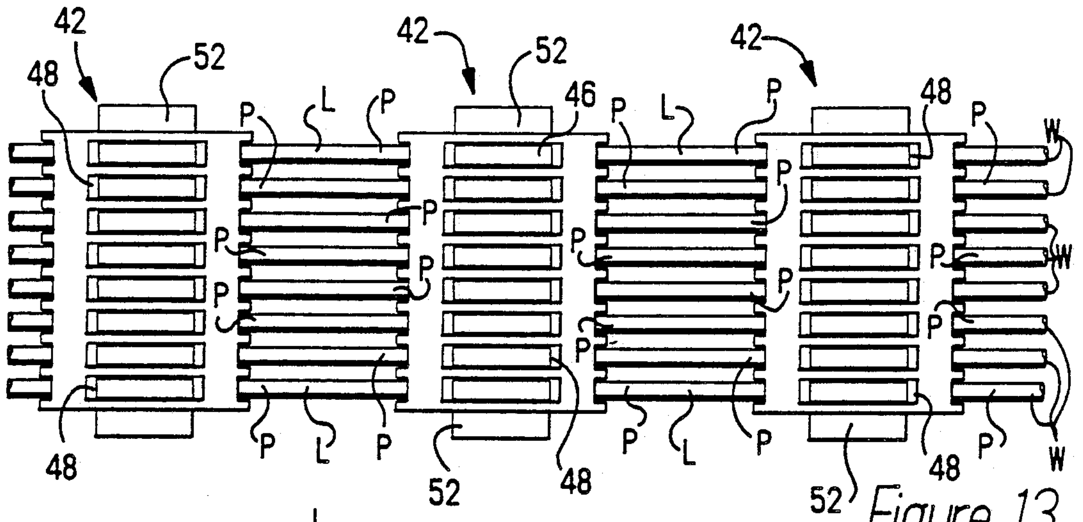
FIG. 13 is a diagram illustrating a step in the manufacture of the header.

The manner of manufacture of a strip of headers 40 of indefinite length will now be described with reference to FIG. 13 in particular, in which three blocks 42, only, are shown by way of example. The contact elements 44 are provided by molding into the blocks 42 during their manufacture by molding, a row of paralleled wires W, the windows 48 being formed during the molding operation to expose said portions of the wires W, and the blocks 42 being carried in parallel relationship on the wires W as shown in FIG. 13. The strip of headers so formed is wound upon a storage reel (now shown), which is subsequently mounted to a robotic machine (not shown) for assembling each header to a board PCB. As the strip is passed through the machine, the machine severs each wire W at a severing point P closely proximate to a respective edge of a respective block 42, whereby alternate wires W are severed on each side of each block 42. Be it noted that the length of each wire length L spanning the blocks 42 corresponds to the intended length of the legs 50 to be produced. Before assembling a block 42 to a board PCB, the machine bends down a of the severed lengths L at right angles to the block 42 to provide the legs 50. Since none of the lengths L is severed out of its wire W, there is no waste of wire. When the header so provided has been assembled to its board PCB, the legs 50 are soldered to the conductors C.

Figure 14:
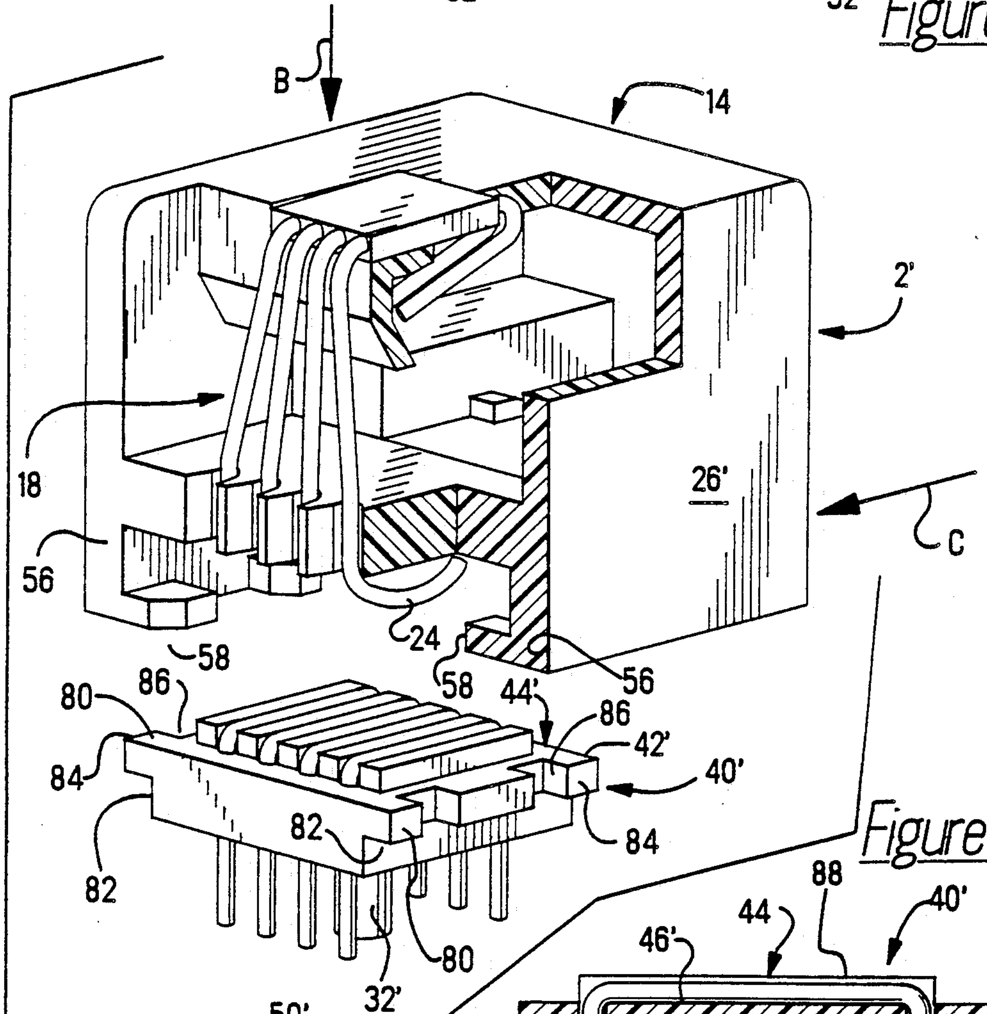
FIG. 14 is an isometric, exploded, view of an electrical jack and header assembly according to a second embodiment of the invention.
Figure 15:
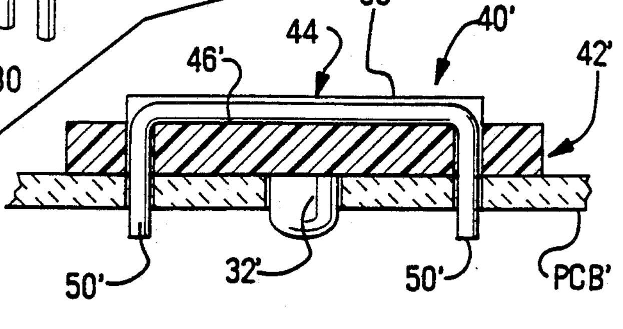
FIG. 15 is a longitudinal sectional view of the header of FIG. 14 when assembled to a printed circuit board.

The second embodiment of the invention will now be described with reference to FIGS. 14 and 15. An electrical jack and header assembly comprises an electrical jack 2′ and an electrical header 40′. Those parts of the jack 2′, which are substantially the same as corresponding parts of the jack 2, bear the same reference numerals thereas and will not be further described. The housing 4′ of the jack 2′ has depending form each of its side walls 26′, a pair of spaced arms 56 (only two of these arms are shown) having inwardly projecting end portions 58 extending at right angles to the remainder of the arms 56, an arm 56 on one sidewall 26′ being disposed opposite to an arm 56 on the other sidewall 26′. The header 40′ comprises an insulating block 42′ having lateral edges 80 formed with undercuts 82. The margins 84 of the block 42′, which overhang the undercuts 82 are formed with spaced notches 86 each for receiving therethrough a respective arm end portion 58. Drawn wire contact elements 44′, each have on one side of the block 42′ a contact portion 46, these contact portions being separated from each other by ribs 88 therebetween, upstanding from the block 42′. Each contact element 44′ further comprises a pair of legs 50′ for insertion in holes in a printed circuit board PCB′, the block 40′ being formed with depending guide spigots 32′ for insertion into further holes in the board PCB′. The jack 2′ is mated with the header 40′ by moving it down thereon in the direction indicated by the arrow B in FIG. 14 so that each end portion 58 passes through a respective notch 86 and then sliding the jack 2′ forwardly as indicated by the arrow C in FIG. 14 by a very short distance, so that the portions 58 slide along the undercuts 82 whereby the jack 2′ is secured to the header 40′ with the loops 24 of the contact tails 18 each in resilient engagement with a respective contact portion 46'. As the contact portions 46' are intermediate the lengths of the contact elements 44' and the loops 24 engage the portions 46' at right angles thereto, the ends of the wires from which the contact elements 44' are made, do not need to be formed with tapered ends.

We claim:

1. An electrical jack and header assembly, wherein the jack comprises an insulating housing defining a cavity for receiving an electrical plug, and a row of electrical terminals secured to a wall of the cavity and each having a contact spring extending obliquely thereinto for engaging a respective electrical contact on the plug, and a contact tail depending from said wall, the header comprising an insulating block having securing thereto to a row of contact elements each having on one side of the block, a contact portion, and on the opposite side of the block a leg for insertion in a hole in a printed circuit board, the jack being matable with the header to cause each contact tail of the jack to engage a respective contact portion of the header; wherein each contact tail terminates in a contact surface which is bowed in a direction perpendicular to, and away from, said wall, and in that each contact portion extends across said one side of the insulating block, the leg of each contact element depends from the opposite end of the contact portion thereof to a next adjacent leg of the header, whereby the insertion legs depend from the header in two spaced rows.

2. An assembly according to claim 1 wherein the contact surface of each contact tail is defined by an end portion thereof which has been reversely bent to form a loop.

3. An assembly according to claim 1 wherein there depends from the housing pair of latch arms for latching engagement with respective latch members on opposite ends of the insulating block, and a latching member for latching engagement in an opening in the circuit board.

4. An assembly according to claim 1 wherein there depend from the housing a pair of spaced arms having inwardly projecting end portions for insertion through notches in opposite undercut edges of the insulating block.

5. An electrical jack and header assembly, wherein the jack comprises an insulating housing defining a cavity for receiving an electrical plug, and a row of electrical terminals secured to a wall of the cavity and each having a contact spring extending obliquely thereinto for engaging a respective electrical contact on the plug, and a contact tail depending from said wall, the header comprising an insulating block having secured thereto a row of contact elements each having on one side of said block, a contact portion, and on the opposite side of said block a leg for insertion in a hole in a printed circuit board, the jack being matable with the header to cause each contact tail of the jack to engage a respective contact portion of the header; wherein each contact tail terminates in a contact surface which is bowed in a direction perpendicular to, and away from, said wall, and in that each contact portion extends across said one side of the insulating block, a pair of latch arms depends from the housing for latching engagement with respective latch members on opposite ends of the insulating block, and a latching member for latching engagement is an opening in the circuit board.

6. An assembly according to claim 5 wherein the contact surface of each contact tail is defined by an end portion thereof which has been reversely bent to form a loop.

* * * * *